(12) United States Patent
Wang et al.

(10) Patent No.: US 12,020,606 B2
(45) Date of Patent: Jun. 25, 2024

(54) DISPLAY MODULE, CRACK DETECTION METHOD, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhongjie Wang, Beijing (CN); Lei Zhang, Beijing (CN); Guangran Guo, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 18/014,552

(22) PCT Filed: Nov. 9, 2021

(86) PCT No.: PCT/CN2021/129500
§ 371 (c)(1),
(2) Date: Jan. 5, 2023

(87) PCT Pub. No.: WO2022/227483
PCT Pub. Date: Nov. 3, 2022

(65) Prior Publication Data
US 2023/0252922 A1 Aug. 10, 2023

(30) Foreign Application Priority Data
Apr. 29, 2021 (CN) .......................... 202110474985.1

(51) Int. Cl.
*G09G 3/00* (2006.01)
*H10K 50/84* (2023.01)

(52) U.S. Cl.
CPC ............. *G09G 3/006* (2013.01); *H10K 50/84* (2023.02); *G09G 2330/021* (2013.01); *G09G 2330/04* (2013.01)

(58) Field of Classification Search
CPC ............. G09G 3/006; G09G 2330/021; G09G 2330/04; G09G 2300/0426; G09G 3/3208; H10K 50/84; H10K 71/70; H10K 59/131
See application file for complete search history.

(56) References Cited

U.S. PATENT DOCUMENTS 9,581,841 B2 * 2/2017 Yanagisawa ........... G09G 3/006
9,653,368 B2 * 5/2017 Kwak .................... H10K 50/84
(Continued)

FOREIGN PATENT DOCUMENTS

CN          105374311 A      3/2016
CN          107680481 A      2/2018
(Continued)

OTHER PUBLICATIONS

First Office Action for the Chinese Patent Application No. 202110474985.1 issued by the Chinese Patent Office on Aug. 5, 2022.
(Continued)

*Primary Examiner* — Michael J Jansen, II
(74) *Attorney, Agent, or Firm* — IP & T GROUP LLP

(57) ABSTRACT

A display module includes a display panel and a detection circuit. The display panel has a display area and a bezel area located beside the display area. The display panel includes a first detection line disposed in the bezel area. The first detection line is coupled to at least one detection signal receiving terminal and at least one detection signal output terminal. The detection circuit is coupled to a detection signal input terminal and a first detection signal detecting
(Continued)

terminal. The detection signal input terminal is coupled to the at least one detection signal receiving terminal, and the at least one detection signal output terminal is coupled to the first detection signal detecting terminal. The detection circuit is configured to: generate and transmit a detection signal to the first detection line; and receive the detection signal passing through the first detection line.

18 Claims, 9 Drawing Sheets

(56) References Cited

U.S. PATENT DOCUMENTS

| | | | | |
|---|---|---|---|---|
| 9,952,264 | B2* | 4/2018 | Brahma | G09G 3/2092 |
| 9,983,452 | B2* | 5/2018 | Jia | G02F 1/1309 |
| 10,037,722 | B2* | 7/2018 | Trock | G09G 3/006 |
| 10,037,726 | B2* | 7/2018 | Lee | G09G 3/2003 |
| 10,078,976 | B2* | 9/2018 | Nam | G09G 3/006 |
| 10,210,782 | B2* | 2/2019 | Lee | G09G 3/006 |
| 10,495,935 | B2* | 12/2019 | Nagasawa | G02F 1/136286 |
| 10,522,431 | B2* | 12/2019 | Kim | H01L 27/1255 |
| 10,733,922 | B2* | 8/2020 | Park | G09G 3/20 |
| 10,861,361 | B2* | 12/2020 | Kim | H10K 71/70 |
| 11,011,085 | B2* | 5/2021 | Lee | H10K 59/131 |
| 11,087,670 | B2* | 8/2021 | Mandlik | H10K 71/70 |
| 11,183,089 | B2* | 11/2021 | Ryu | G09G 3/035 |
| 11,341,875 | B2* | 5/2022 | Lee | G09G 3/035 |
| 11,367,391 | B2* | 6/2022 | Zhou | G09G 3/00 |
| 11,922,838 | B2* | 3/2024 | Wang | H10K 59/131 |
| 11,928,994 | B2* | 3/2024 | Lee | G09G 3/006 |
| 2013/0083457 | A1* | 4/2013 | Wurzel | G02F 1/1309 |
| | | | | 700/109 |
| 2014/0176844 | A1* | 6/2014 | Yanagisawa | G02F 1/1309 |
| | | | | 349/43 |
| 2016/0043010 | A1* | 2/2016 | Kwak | H01L 22/14 |
| | | | | 438/15 |
| 2016/0203777 | A1* | 7/2016 | Brahma | G01R 27/205 |
| | | | | 345/87 |
| 2016/0247436 | A1* | 8/2016 | Lee | G09G 3/006 |
| 2017/0124929 | A1* | 5/2017 | Trock | G09G 3/006 |
| 2017/0199439 | A1* | 7/2017 | Jia | G02F 1/136259 |
| 2017/0270842 | A1* | 9/2017 | Nam | H01L 27/124 |
| 2018/0033354 | A1* | 2/2018 | Lee | G09G 3/006 |
| 2018/0033355 | A1* | 2/2018 | Lee | H10K 59/88 |
| 2018/0158741 | A1* | 6/2018 | Kim | H01L 22/32 |
| 2018/0174505 | A1* | 6/2018 | Mandlik | G09G 3/035 |
| 2018/0350284 | A1* | 12/2018 | Park | G09G 3/006 |
| 2018/0373106 | A1* | 12/2018 | Nagasawa | G02F 1/1343 |
| 2019/0057632 | A1* | 2/2019 | Kim | G09G 3/3291 |
| 2019/0285691 | A1* | 9/2019 | Ryu | G09G 3/006 |
| 2020/0090566 | A1* | 3/2020 | Lee | G01R 27/08 |
| 2021/0248938 | A1* | 8/2021 | Lee | G09G 3/20 |
| 2021/0335974 | A1* | 10/2021 | Zhou | G09G 3/00 |
| 2022/0254285 | A1* | 8/2022 | Wang | G09G 3/006 |

FOREIGN PATENT DOCUMENTS

| | | |
|---|---|---|
| CN | 108986728 A | 12/2018 |
| CN | 109427273 A | 3/2019 |
| CN | 109682856 A | 4/2019 |
| CN | 109859672 A | 6/2019 |
| CN | 110634411 A | 12/2019 |
| CN | 110718577 A | 1/2020 |
| CN | 111048021 A | 4/2020 |
| CN | 111048022 A | 4/2020 |
| CN | 111509026 A | 8/2020 |
| CN | 111540294 A | 8/2020 |
| CN | 111653225 A | 9/2020 |
| CN | 111739453 A | 10/2020 |
| CN | 112262425 A | 1/2021 |
| CN | 113205758 A | 8/2021 |

OTHER PUBLICATIONS

Second Office Action for the Chinese Patent Application No. 202110474985.1 issued by the Chinese Patent Office on Mar. 25, 2023.

* cited by examiner

DISPLAY MODULE, CRACK DETECTION METHOD, AND DISPLAY APPARATUS

CROSS-REFERENCE TO RELATED APPLICATIONS

This application is a national phase entry under 35 USC 371 of International Patent Application No. PCT/CN 2021/129500 filed on Nov. 9, 2021, which claims priority to Chinese Patent Application No. 202110474985.1, filed on Apr. 29, 2021, which are incorporated herein by reference in their entirety.

TECHNICAL FIELD

The present disclosure relates to the field of display technologies, and in particular, to a display module, a crack detection method, and a display apparatus.

BACKGROUND

Organic light-emitting diode (OLED) display apparatuses have advantages of thinness, lightness, wide viewing angle, active luminescence, continuously adjustable light-emitting color, low cost, fast response, low energy consumption, low driving voltage, wide operating temperature range, simple production process, and high light-emitting efficiency, and become a hot spot pursued by current display products.

SUMMARY

In an aspect, a display module is provided. The display module includes a display panel and a detection circuit. The display panel has a display area and a bezel area located beside the display area. The display panel includes a first detection line disposed in the bezel area. The first detection line is coupled to at least one detection signal receiving terminal and at least one detection signal output terminal. The detection circuit is coupled to a detection signal input terminal and a first detection signal detecting terminal. The detection signal input terminal is coupled to the at least one detection signal receiving terminal, and the at least one detection signal output terminal is coupled to the first detection signal detecting terminal. The detection circuit is configured to: generate and transmit a detection signal to the first detection line through the detection signal input terminal and the at least one detection signal receiving terminal in sequence; and receive the detection signal passing through the first detection line and transmitted from the at least one detection signal output terminal to the first detection signal detecting terminal.

In some embodiments, the detection circuit includes a power management chip and a resistor. The power management chip is configured to generate the detection signal. An end of the resistor is coupled to the power management chip, and another end of the resistor is coupled to the detection signal input terminal. The resistor is configured to reduce an amplitude of the detection signal.

In some embodiments, the another end of the resistor and the detection signal input terminal are further coupled to a second detection signal detecting terminal.

In some embodiments, the first detection line has a loop shape with an opening, and surrounds the display area. The first detection line has a first end and a second end. The at least one detection signal receiving terminal includes a detection signal receiving terminal, and the first end of the first detection line is coupled to the detection signal receiving terminal. The at least one detection signal output terminal includes a detection signal output terminal, and the second end of the first detection line is coupled to the detection signal output terminal.

In some embodiments, the first detection line has a first end, a second end, a first node and a second node. The first detection line includes a first sub-detection line located between the first end and the first node, a second sub-detection line located between the first node and the second node, and a third sub-detection line located between the second node and the second end. The second sub-detection line has a loop shape with an opening, and surrounds the display area. The first sub-detection line and the third sub-detection line are respectively located on two opposite sides of the display area. The second sub-detection line is coupled to the at least one detection signal receiving terminal. The at least one detection signal output terminal includes two detection signal output terminals, and the first end and the second end of the first detection line are respectively coupled to the two detection signal output terminals.

In some embodiments, the display panel further includes: a plurality of data lines and a plurality of second detection lines disposed in the display area; a plurality of sub-pixels coupled to the plurality of data lines and the plurality of second detection lines; and a plurality of display transistors and a plurality of detection transistors disposed in the bezel area. An extending direction of the plurality of data lines is the same or approximately the same as an extending direction of the plurality of second detection lines. Control electrodes of the plurality of display transistors and control electrodes of the plurality of detection transistors are coupled to a first control signal receiving terminal. First electrodes of the plurality of display transistors are coupled to at least one display signal receiving terminal, and a second electrode of a display transistor in the plurality of display transistors is coupled to a data line in the plurality of data lines. First electrodes of the plurality of detection transistors are coupled to the first detection line, and a second electrode of a detection transistor in the plurality of detection transistors is coupled to a second detection line in the plurality of second detection lines. The detection circuit is further coupled to a first control signal input terminal and a display signal input terminal. The detection circuit is further configured to: generate and transmit a first control signal to the first control signal receiving terminal through the first control signal input terminal; and generate and transmit a display signal to the display signal receiving terminal through the display signal input terminal. The display transistors are configured to be turned on under a control of the first control signal to transmit the display signal to the data lines, so that corresponding sub-pixels are in a first display state. The detection transistors are configured to be turned on under the control of the first control signal to transmit the detection signal passing through the first detection line to the second detection lines, so that corresponding sub-pixels are in a second display state.

In some embodiments, in a case where the detection circuit includes the power management chip, an end of the power management chip coupled to the resistor is further coupled to the display signal input terminal. The power management chip is further configured to generate the display signal. The detection circuit further includes a timing controller and a level converter. The timing controller is configured to generate a general purpose input-output level signal. An end of the level converter is coupled to the timing controller, and another end of the level converter is coupled to the first control signal input terminal. The level converter is configured to convert the general purpose input-output level signal into the first control signal, and transmit the first control signal to the first control signal input terminal.

In some embodiments, in a case where the first detection line includes the first sub-detection line, the second sub-detection line and the third sub-detection line, the first sub-detection line is coupled to at least one detection transistor in the plurality of detection transistors, and the third sub-detection line is coupled to at least one detection transistor in the plurality of detection transistors.

In some embodiments, the plurality of data lines and the plurality of second detection lines are made of a same material, and are arranged in a same layer.

In some embodiments, the display module further includes a circuit board and at least one COF. The circuit board is coupled to the detection circuit. An end of the COF is bonded to the circuit board, and another end of the COF is bonded to the display panel.

In some embodiments, the display module further includes at least one source driver chip bonded to the at least one COF. In a case where the detection circuit further includes the timing controller, a source driver chip in the at least one source driver chip is coupled to the timing controller. In a case where the display panel further includes the plurality of data lines and the plurality of second detection lines, the source driver chip is further coupled to at least one data line in the plurality of data lines and at least one second detection line in the plurality of second detection lines. The timing controller is further configured to generate a second control signal. The source driver chip is configured to allow the at least one second detection line to be in a floating state under a control of the second control signal.

In another aspect, a crack detection method is provided. The crack detection method is used for a crack detection of the display module in any one of the above embodiments. The crack detection method includes: generating and transmitting, by the detection circuit, the detection signal to the first detection line through the detection signal input terminal and the at least one detection signal receiving terminal in sequence; receiving, by the detection circuit, the detection signal passing through the first detection line and transmitted from the at least one detection signal output terminal to the first detection signal detecting terminal; comparing the detection signal generated by the detection circuit with the detection signal passing through the first detection line and received by the detection circuit; and determining whether the display panel has a crack according to a comparison result.

In some embodiments, the crack detection method further includes: generating, by the detection circuit, the first control signal and the display signal; receiving and transmitting, by the plurality of display transistors turned on under the control of the first control signal, the display signal to the plurality of data lines, so that the corresponding sub-pixels are in the first display state; receiving and transmitting, by the plurality of detection transistors turned on under the control of the first control signal, the detection signal passing through the first detection line to the plurality of second detection lines, so that the corresponding sub-pixels are in the second display state; and determining whether the display panel has a crack according to the second display state.

In yet another aspect, a display apparatus is provided. The display apparatus includes the display module in any one of the above embodiments.

In some embodiments, a resistance value of the resistor is less than or equal to 10Ω.

In some embodiments, the first sub-detection line and the third sub-detection line are located on a side of the second sub-detection line proximate to the display area.

In some embodiments, the first sub-detection line and the third sub-detection line each are U-shaped, and each surround a portion of the display area.

In some embodiments, the plurality of display transistors and the plurality of detection transistors are located on a same side of the display area.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product and an actual process of a method involved in the embodiments of the present disclosure.

DETAILED DESCRIPTION

Figure 1:
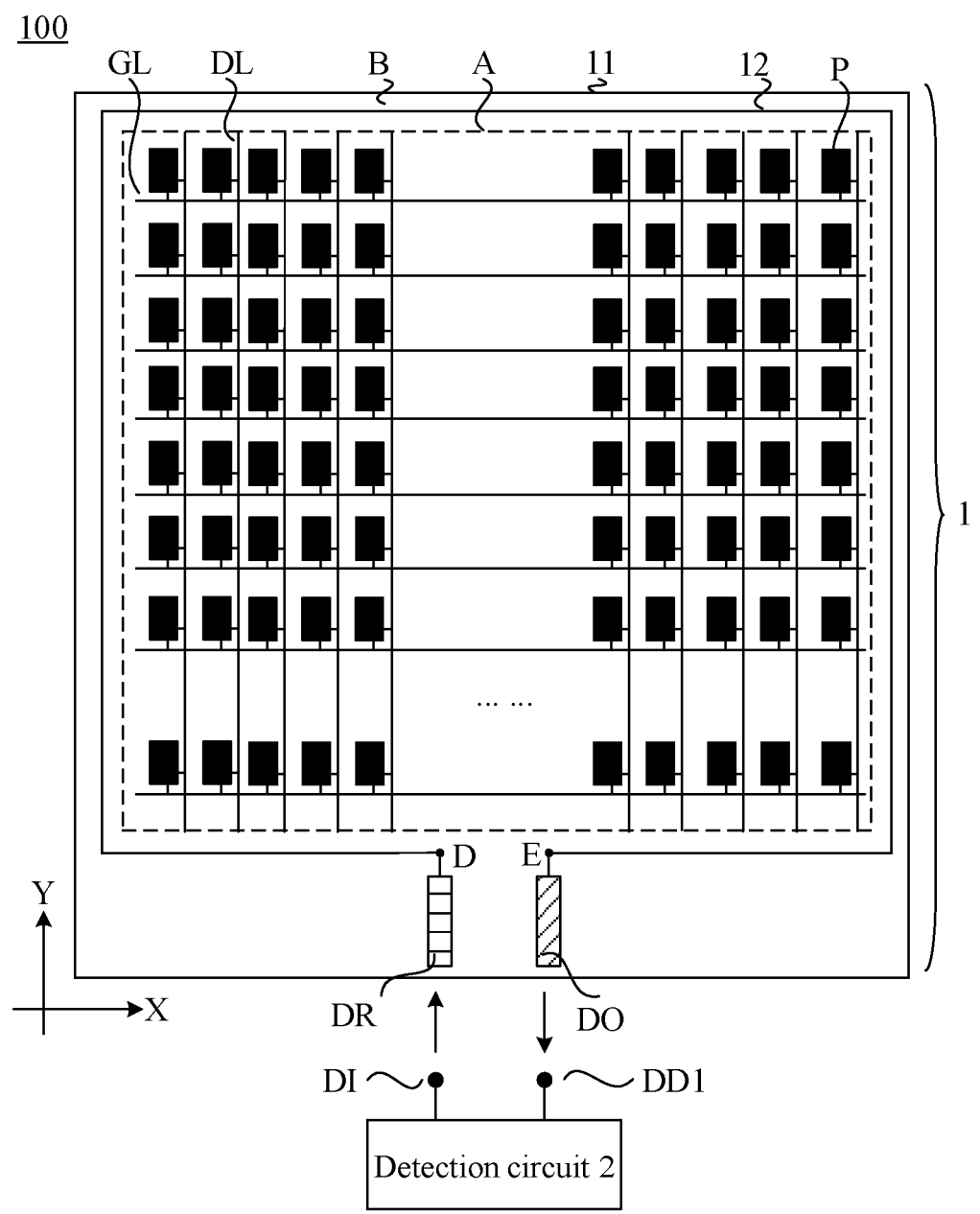
FIG. 1 is a structural diagram of a display module, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "coupled" and derivatives thereof may be used. For example, the term "coupled" may be used in the description of some embodiments to indicate that two or more components are in direct physical or electrical contact. However, the term "coupled" may also mean that two or more components are not in direct contact with each other, but still cooperate or interact with each other. The embodiments disclosed herein are not necessarily limited to the contents herein.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Transistors provided in the embodiments of the present disclosure may be thin film transistors, field effect transistors (e.g., oxide thin film transistors), or other switching devices with same characteristics. A description will be made in the embodiments of the present disclosure by taking the thin film transistors as an example.

In some embodiments, a control electrode of each transistor is a gate of the transistor, a first electrode of the transistor is one of a source and a drain of the transistor, and a second electrode of the transistor is another one of the source and the drain of the transistor. Since a source and a drain of a transistor may be symmetrical in structure, the source and the drain of the transistor may be same in structure. That is, the first electrode and the second electrode of the transistor in the embodiments of the present disclosure may be same in structure. For example, in a case where the transistor is a P-type transistor, the first electrode of the transistor is a source, and the second electrode of the transistor is a drain. For example, in a case where the transistor is an N-type transistor, the first electrode of the transistor is a drain, and the second electrode of the transistor is a source.

In the related art, after a display panel is manufactured, crack(s) are easily generated at an edge of the display panel due to uneven stress in a process of cutting or transporting the display panel. Over time, the crack(s) tend to extend into the display panel, so that an internal structure of the display panel is damaged, thereby affecting the display quality and the service life of the display panel.

At present, driver chips (e.g., source driver chips) bonded in some display modules are not integrated with a panel crack detection (PCD) function, so that the display module does not have the PCD function, and cannot detect whether crack(s) exist in a display panel. Thus, in a case where the display panel has crack(s), and a subsequent process (e.g., manufacturing or attachment of a touch structure) is performed, waste of materials is easily caused.

Figure 11:
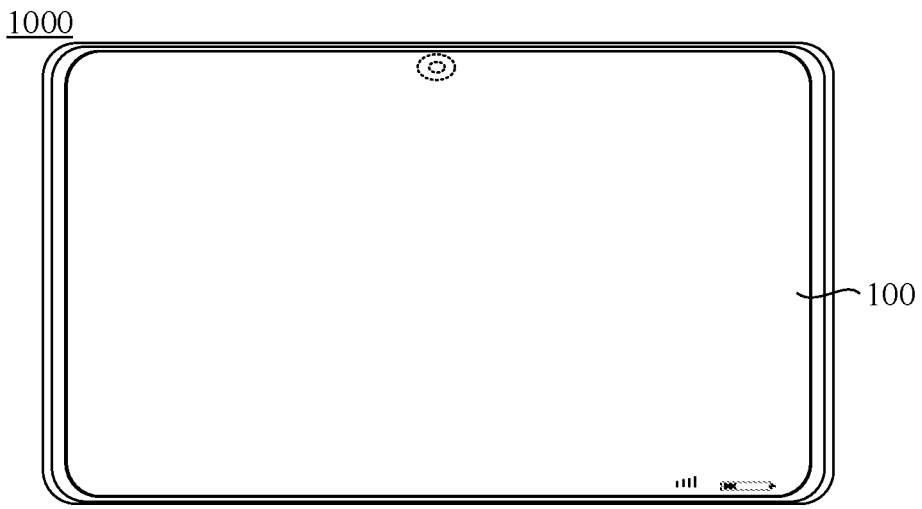
FIG. 11 is a structural diagram of a display apparatus, in accordance with some embodiments of the present disclosure.

Based on this, some embodiments of the present disclosure provide a display apparatus 1000. As shown in FIG. 11, the display apparatus 1000 includes a display module 100.

In some examples, the display apparatus 1000 may further include a touch structure, a color filter or a cover plate disposed on a light exit side of the display module 100.

In some embodiments, the display apparatus 1000 may be any product or component with a display function, such as a mobile phone, a tablet computer, a display, a notebook computer, a digital photo frame, or a navigator. The display apparatus 1000 may be, for example, a foldable display apparatus or a non-foldable display apparatus.

A structure of the display module 100 will be schematically described below. As shown in FIGS. 1 to 8, the display module 100 includes a display panel 1 and a detection circuit 2.

In some examples, as shown in FIGS. 1 to 8, the display panel 1 has a display area A and a bezel area B located beside the display area A.

A shape of the display area A varies, and may be set according actual needs. For example, the display area A may have a rectangular, approximately rectangular, circular or elliptical shape. The approximately rectangular shape refers to a non-strict rectangle. For example, four inner corners of the non-strict rectangle may be rounded. Alternatively, a certain side of the non-strict rectangle is, for example, not straight.

For example, the term "located beside" means that the bezel area B is located on a side, two sides, or a peripheral side of the display area A. Accordingly, the bezel area B may be located on a side or two sides of the display area A. Alternatively, the bezel area B may surround the display area A.

The structure of the display module 100 will be schematically described in an example where the display area A has the rectangular shape, and the bezel area B surrounds the display area A.

In some examples, as shown in FIGS. 1 to 8, the display panel 1 may include a substrate 11.

A type of the substrate 11 varies, and may be set according to actual needs.

For example, the substrate 11 may be a rigid substrate. The rigid substrate may be, for example, a glass substrate or a polymethyl methacrylate (PMMA) substrate.

For example, the substrate 11 may be a flexible substrate. The flexible substrate may be, for example, a polyethylene terephthalate (PET) substrate, a polyethylene naphthalate two formic acid glycol ester (PEN) substrate or a polyimide (PI) substrate. In this case, the display panel 1 may be a flexible display panel.

In some examples, as shown in FIGS. 1 to 8, the display panel 1 may further include a plurality of sub-pixels P disposed on a side of the substrate 11 and located in the display area A.

Figure 2:
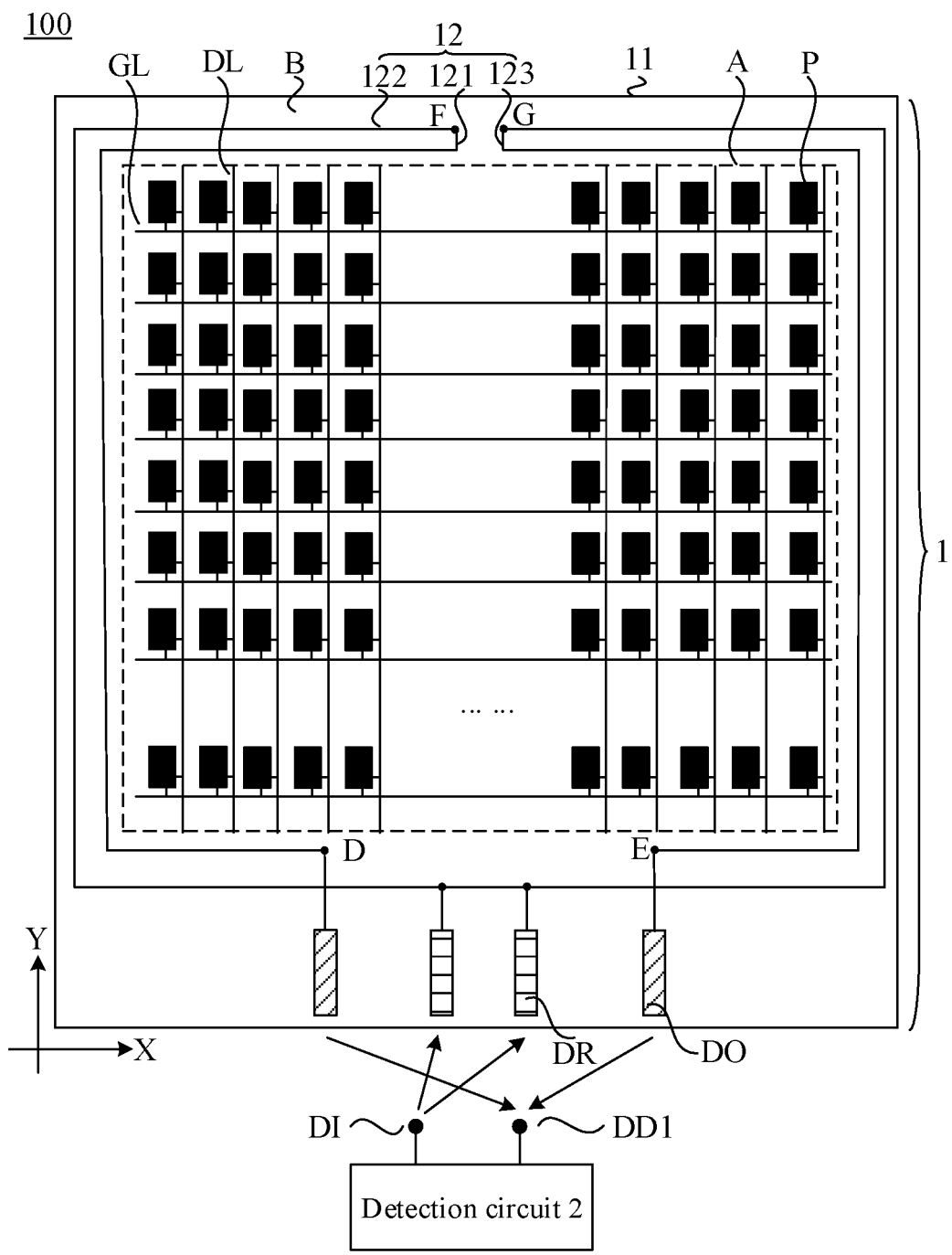
FIG. 2 is a structural diagram of another display module, in accordance with some embodiments of the present disclosure.
Figure 3:
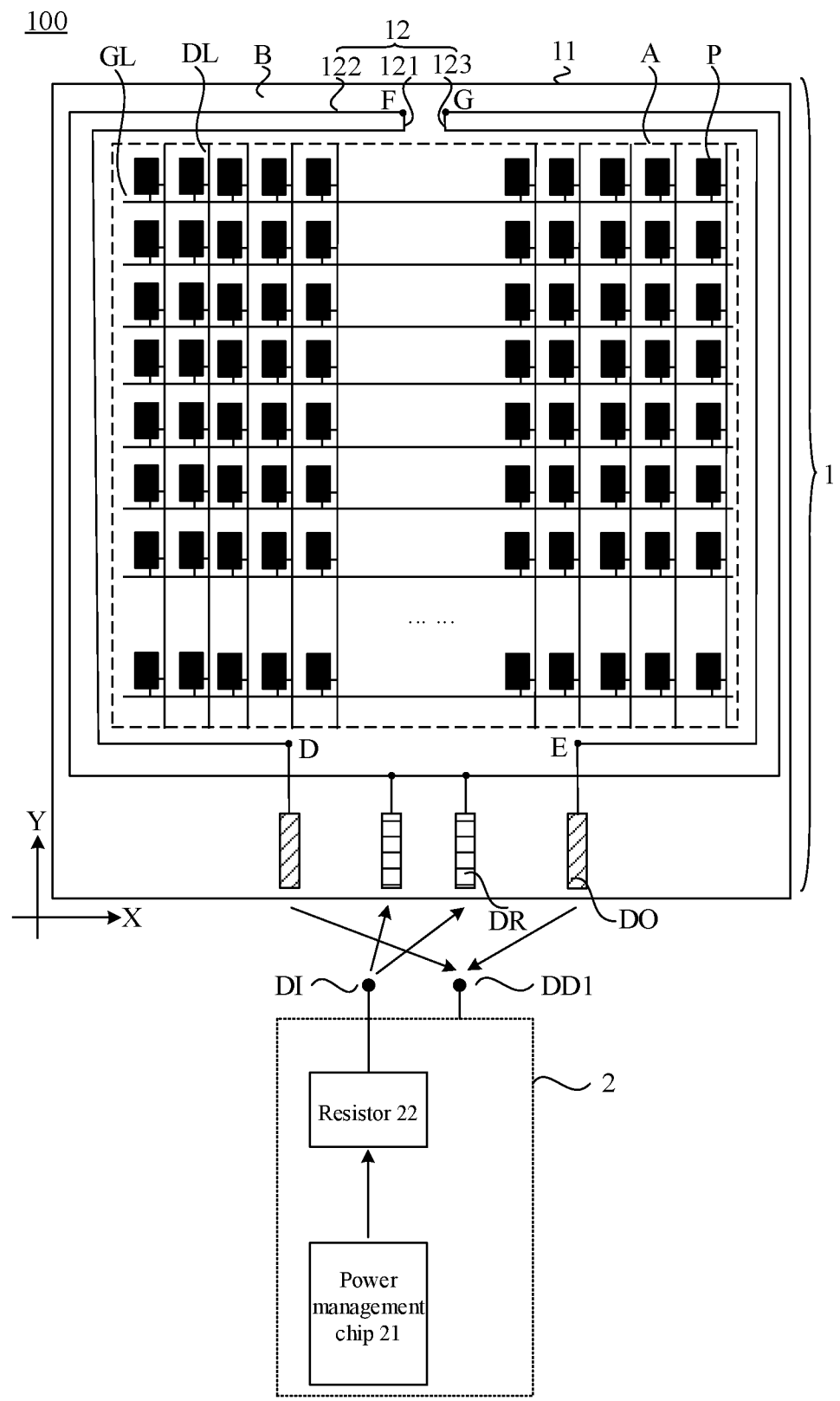
FIG. 3 is a structural diagram of yet another display module, in accordance with some embodiments of the present disclosure.

For example, as shown in FIGS. 1 to 3, the plurality of sub-pixels P may be arranged in rows along a first direction X, and may be arranged in columns along a second direction Y. Each row of sub-pixels P may include sub-pixels P, and each column of sub-pixels P may include sub-pixels. The number of sub-pixels P included in a row of sub-pixels P may be the same as or different from the number of sub-pixels P included in a different row of sub-pixels P. The number of sub-pixels P included in a column of sub-pixels P may be the same as or different from the number of sub-pixels P included in a different column of sub-pixels P. The number of sub-pixels P included in each of different rows of sub-pixels P and the number of sub-pixels P included in each of different columns of sub-pixels P may be set according to actual needs (e.g., the shape of the display panel 1 or the shape of the display area A).

Here, the first direction X and the second direction Y intersect. An included angle between the first direction X and the second direction Y may be set according to actual needs. For example, the included angle between the first direction X and the second direction Y may be 85 degrees, 89 degrees, 90 degrees, 92 degrees or 95 degrees.

For example, each of the plurality of sub-pixels P may include a pixel driving circuit and a light-emitting device electrically connected to the pixel driving circuit. Along a direction perpendicular to the substrate 11, the light-emitting device may, for example, be located on a side of the pixel driving circuit away from the substrate 11.

A structure of the light-emitting device varies, and may be set according to actual needs. For example, the light-emitting device may be an OLED, a quantum dot light-emitting diode (QLED) or a micro light-emitting diode (Micro LED).

A schematic description will be made in the embodiments of the present disclosure in an example where the light-emitting device is the OLED. In this case, the light-emitting device may include an anode, a light-emitting layer and a cathode that are stacked in sequence. In addition, the light-emitting device may further include, for example, a hole injection layer and/or a hole transport layer disposed between the anode and the light-emitting layer. The light-emitting device may further include, for example, an electron transport layer and/or an electron injection layer disposed between the light-emitting layer and the cathode. The pixel driving circuit is electrically connected to, for example, the anode of the light-emitting device.

A structure of the pixel driving circuit varies, and may be set according to actual needs. For example, the pixel driving circuit may have a structure such as "2T1C," "3T1C," "6T1C," "7T1C," "6T2C" or "7T2C". Here, "T" represents a transistor, and a number before "T" represents the number of transistors, "C" represents a capacitor, and a number before "C" represents the number of capacitors.

In some examples, as shown in FIGS. 1 to 3, the display panel 1 may further include a plurality of gate lines GL disposed on the side of the substrate 11 and extending along the first direction X, and a plurality of data lines DL disposed on the side of the substrate 11 and extending along the second direction Y. The plurality of data lines DL may be located on a side of the plurality of gate lines GL away from the substrate 1, and are insulated from the gate lines GL.

For example, pixel driving circuits in sub-pixels P arranged in a row along the first direction X may be electrically connected to a gate line GL, so as to receive a scan signal transmitted by the gate line GL; and pixel driving circuits in sub-pixels P arranged in a column along the second direction Y may be coupled to (may be electrically connected to) a data line DL, so as to receive a data signal transmitted by the data line DL. A pixel driving circuit in each sub-pixel P may drive a corresponding light-emitting device to emit light under a cooperation of the scan signal and the data signal.

In some examples, as shown in FIGS. 1 to 8, the display panel 1 may further include a first detection line 12 disposed in the bezel area B. The first detection line 12, the sub-pixels P, the gate lines GL and the data lines DL are located on the same side of the substrate 11.

For example, as shown in FIGS. 1 to 8, the first detection line 12 is coupled to at least one detection signal receiving terminal DR and at least one detection signal output terminal DO. That is, the first detection line 12 may be coupled to one or more detection signal receiving terminals DR, and may further be coupled to one or more detection signal output terminals DO. The coupling in this example may refer to an electrical connection.

Here, a connection relationship between the first detection line 12 and the detection signal receiving terminal DR and a connection relationship between the first detection line 12 and the detection signal output terminal DO are related to a structure of the first detection line 12. The structure of the first detection line 12 varies, and may be set according to actual needs.

For example, as shown in FIG. 1, the first detection line 12 has a loop shape with an opening, and surrounds the display area A. The first detection line has a first end D and a second end E.

In this case, the first detection line 12 may be electrically connected to, for example, a single detection signal receiving terminal DR and a single detection signal output terminal DO. The first end D of the first detection line 12 may be coupled to the single detection signal receiving terminal DR, and the second end E of the first detection line 12 may be coupled to the single detection signal output terminal DO.

In this case, a detection signal received by the detection signal receiving terminal DR may be transmitted to the detection signal output terminal DO through the entire first detection line 12.

The first detection line 12 is arranged to have the loop shape with the opening, so that on a basis of ensuring that the first detection line 12 surrounds the display area A, and is capable of performing a crack detection on the most of an edge of the display panel 1, an occupied area of the first detection line 12 to the bezel area B may be reduced, which is conducive to reducing a size of the bezel area B, thereby enabling the display panel 1 to realize a narrow bezel.

For another example, as shown in FIGS. 2 to 8, the first detection line 12 has a first end D, a second end E, a first node F and a second node G. The first detection line 12 includes a first sub-detection line 121 located between the first end D and the first node F, a second sub-detection line 122 located between the first node F and the second node G, and a third sub-detection line 123 located between the second node G and the second end E. The second sub-detection line 122 has a loop shape with an opening, and surrounds the display area A. The first sub-detection line 121 and the third sub-detection line 123 are respectively located on two opposite sides of the display area A.

The first sub-detection line 121 and the third sub-detection line 123 each are U-shaped, and each surround a portion of the display area A.

The first sub-detection line 121 and the third sub-detection line 123 may be located on a side of the second sub-detection line 122 away from the display area A. Of course, as shown in FIGS. 2 to 8, the first sub-detection line 121 and the third sub-detection line 123 may be located on a side of the second sub-detection line 122 proximate to the display area A.

In this case, the first detection line 12 may be coupled to, for example, at least one detection signal receiving terminal DR and a plurality of detection signal output terminals DO.

The first detection line 12 is coupled to two detection signal output terminals DO. In this case, the second sub-detection line 122 may be coupled to the at least one detection signal receiving terminal DR. The first end D and the second end E of the first detection line 12 may be respectively coupled to two detection signal output terminals DO.

In this case, a detection signal received by the detection signal receiving terminal DR may be transmitted to the detection signal output terminal DO coupled to the first end D through a portion located between a position where the first detection line 12 is coupled to the detection signal receiving terminal DR and the first end D, and may also be transmitted to the detection signal output terminal DO coupled to the second end E through a portion located between the position where the first detection line 12 is coupled to the detection signal receiving terminal DR and the second end E.

The first detection line 12 is arranged into the above structure, so that the entire edge of the display panel 1 may be covered, and thus, the crack detection is able to be performed on the entire edge of the display panel 1, which is conducive to improving an accuracy of a crack detection result of the display panel 1.

In some examples, as shown in FIGS. 1 to 8, the display module 100 may include the detection circuit 2. The detection circuit 2 is coupled to detection signal input terminal(s) DI and first detection signal detecting terminal(s) DD1. The detection signal input terminal(s) DI may be coupled to the detection signal receiving terminal(s) DR, and the detection signal output terminal(s) DO may be coupled to the first detection signal detecting terminal(s) DD1.

The detection signal input terminal DI may be coupled to a single detection signal receiving terminal DR or a plurality of detection signal receiving terminals DR. The detection signal output terminal(s) DO and the first detection signal detecting terminal(s) DD1 may be arranged in one-to-one correspondence.

For example, the coupling between the detection signal input terminal DI and the detection signal receiving terminal DR, and the coupling between the detection signal output terminal DO and the first detection signal detecting terminal DD1 may be realized by bonding.

For example, the detection circuit 2 is configured to: generate and transmit the detection signal to the first detection line 12 through the detection signal input terminal DI and the detection signal receiving terminal DR in sequence, and receive the detection signal passing through the first detection line 12 and transmitted from the detection signal output terminal DO to the first detection signal detecting terminal DD1.

An operating process of the detection circuit 2 for the crack detection will be schematically described below by taking the structure shown in FIG. 2 as an example.

After the display panel 1 is manufactured, the detection circuit 2 is coupled to the display panel 1. The detection signal generated by the detection circuit 2 may be transmitted to the first detection line 12 through the detection signal input terminal DI and the detection signal receiving terminal DR. The detection signal may be transmitted to the first detection signal detecting terminal DD1 through a portion of the second sub-detection line 122 located between the detection signal receiving terminal DR and the first node F, the first sub-detection line 121 and the detection signal output terminal DO coupled to the first end D, and may also be transmitted to the first detection signal detecting terminal DD1 through a portion of the second sub-detection line 122 located between the detection signal receiving terminal DR and the second node G, the third sub-detection line 123 and the detection signal output terminal DO coupled to the second end E.

It will be noted that in a case where crack(s) are generated at the edge of the display panel 1, crack(s) occur at a corresponding position of the first detection line 12, and cause a resistance value of the first detection line 12 to be increased, so that a voltage value of the detection signal passing through the first detection line 12 is reduced.

By detecting the detection signal passing through the first end D of the first detection line 12 or detecting the first detection line 12, and by comparing the detection result (e.g., the voltage value or the resistance value) with a corresponding standard threshold range, it is possible to determine whether there is a crack at the edge of the display panel 1 at a corresponding position. By detecting the detection signal passing through the second end E of the first detection line 12 or detecting the first detection line 12, and by comparing the detection result (e.g., the voltage value or the resistance value) with a corresponding standard threshold range, it is possible to determine whether there is a crack at the edge of the display panel 1 at a corresponding position.

In the case where the crack(s) are generated at the edge of the display panel 1, a subsequent process (e.g., manufacturing of a color filter or a touch structure) may not be performed, so as to reduce waste of materials and prevent water vapor and/or oxygen in the outside from entering the inside of the display panel 1 through the crack(s) to erode the OLED due to the existence of the crack(s), so that the display panel 1 is ensured to have a good display quality and a long service life, and a yield of the display apparatus 1000 formed subsequently is improved.

Thus, in the display module 100 provided in some embodiments of the present disclosure, the first detection line 12 is disposed in the bezel area B of the display panel 1, the detection circuit 2 is disposed, and the detection circuit 2 is coupled to the first detection line 12, so that the detection signal generated by the detection circuit 2 may be transmitted to the first detection line 12. The detection signal passing through the first detection line 12 is received, and is compared with the standard threshold range, so that it is possible to detect whether the display panel 1 has a crack in a case where a driver chip (e.g., a source driver chip) bonded in the display module 100 is not integrated with the PCD function. In this way, the waste of materials may be effectively reduced, and the yield of the display module 100 and the display apparatus 1000 formed subsequently may be improved.

In addition, the detection circuit 2 has a simple structure, and is easy to manufacture, which is conducive to simplifying the process of the crack detection.

In some embodiments, as shown in FIG. 3, the detection circuit 2 includes a power management chip 21 and a resistor 22. The power management chip 21 is configured to generate the detection signal.

In some examples, the detection signal may be referred to as a first voltage signal VGH. The first voltage signal VGH is, for example, a direct current high level signal.

In some examples, as shown in FIG. 3, an end of the resistor 22 is coupled to the power management chip 21, and another end of the resistor 22 is coupled to the detection signal input terminal(s) DI. The resistor 22 is configured to reduce an amplitude of the detection signal.

The coupling between the resistor 22 and the power management chip 21 and the coupling between the resistor 22 and the detection signal input terminal DI each may refer to an electrical connection.

For example, the detection signal may have a large amplitude.

The resistor 22 is disposed between the power management chip 21 and the detection signal input terminal DI, so that the amplitude of the detection signal may be reduced by using the resistor 22, so as to prevent the first detection line 12 from being damaged by an impact of the detection signal, which is conducive to ensuring the structural stability of the first detection line 12 and the accuracy of the detection result.

Here, a resistance value of the resistor 22 may be set according to actual needs. For example, the resistance value of the resistor 22 is less than or equal to 10Ω. For example, the resistance value of the resistor 22 may be 10Ω, 9Ω, 7Ω, 5Ω or 1Ω.

Figure 4:
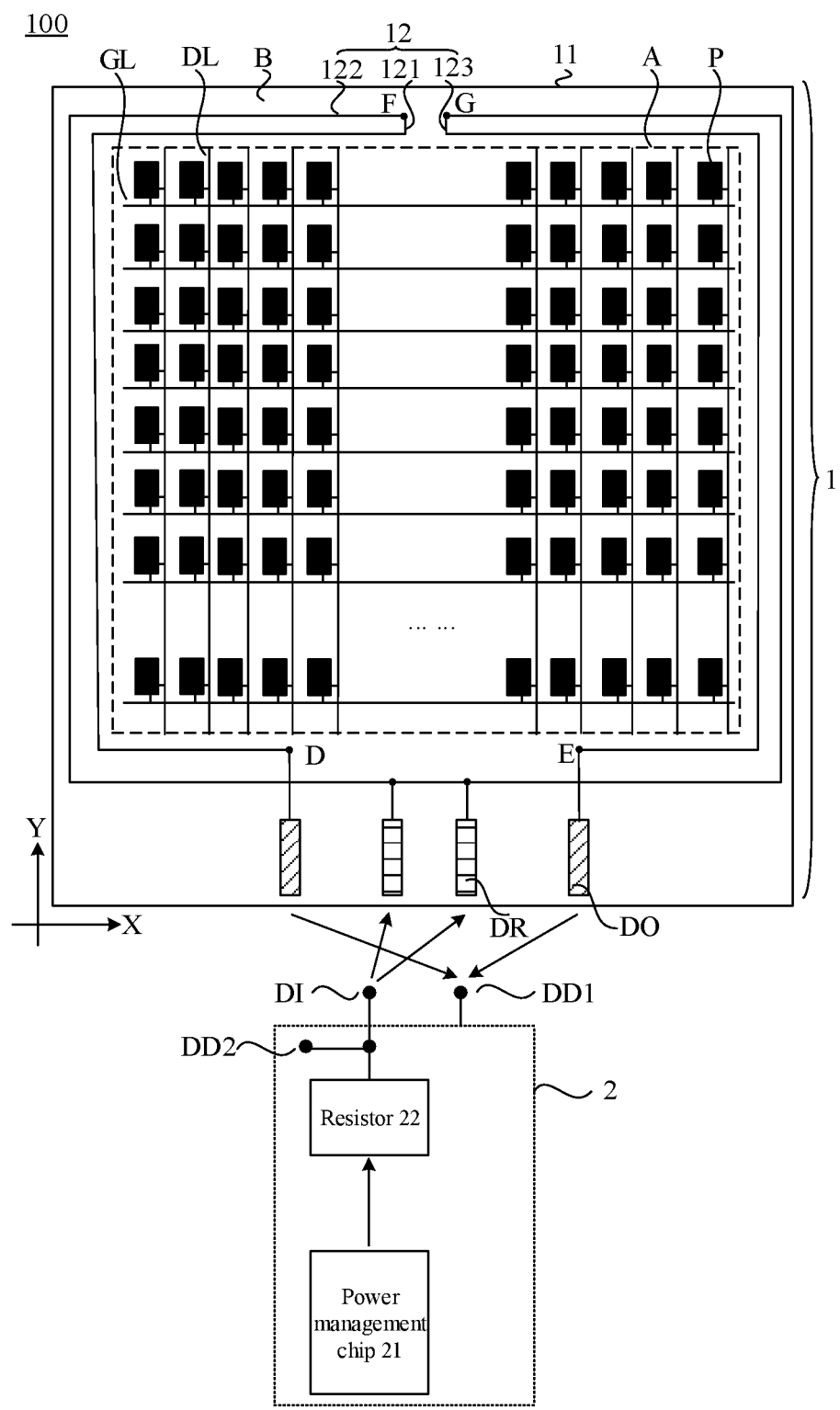
FIG. 4 is a structural diagram of yet another display module, in accordance with some embodiments of the present disclosure.

In some embodiments, as shown in FIG. 4, the another end of the resistor 22 and the detection signal input terminal DI are further coupled to a second detection signal detecting terminal DD2. That is, the second detection signal detecting terminal DD2 is located between the another end of the resistor 22 and the detection signal input terminal DI, so that the detection signal may be transmitted to the detection signal input terminal DI through the resistor 22 and the second detection signal detecting terminal DD2 in sequence. The coupling in this example may refer to an electrical connection.

The second detection signal detecting terminal DD2 is disposed, so that it is possible to detect whether the detection signal exists between the another end of the resistor 22 and the detection signal input terminal DI. In this way, in the process of the crack detection, it can be determined whether the detection signal generated by the power management chip 21 is transmitted to the detection signal input terminal DI, which is conductive to ensuring that the crack detection is able to be normally performed.

It will be noted that during the crack detection of the display panel 1, there may be other detection methods, which may be specifically set according to actual needs, and is not limited.

Figure 5:
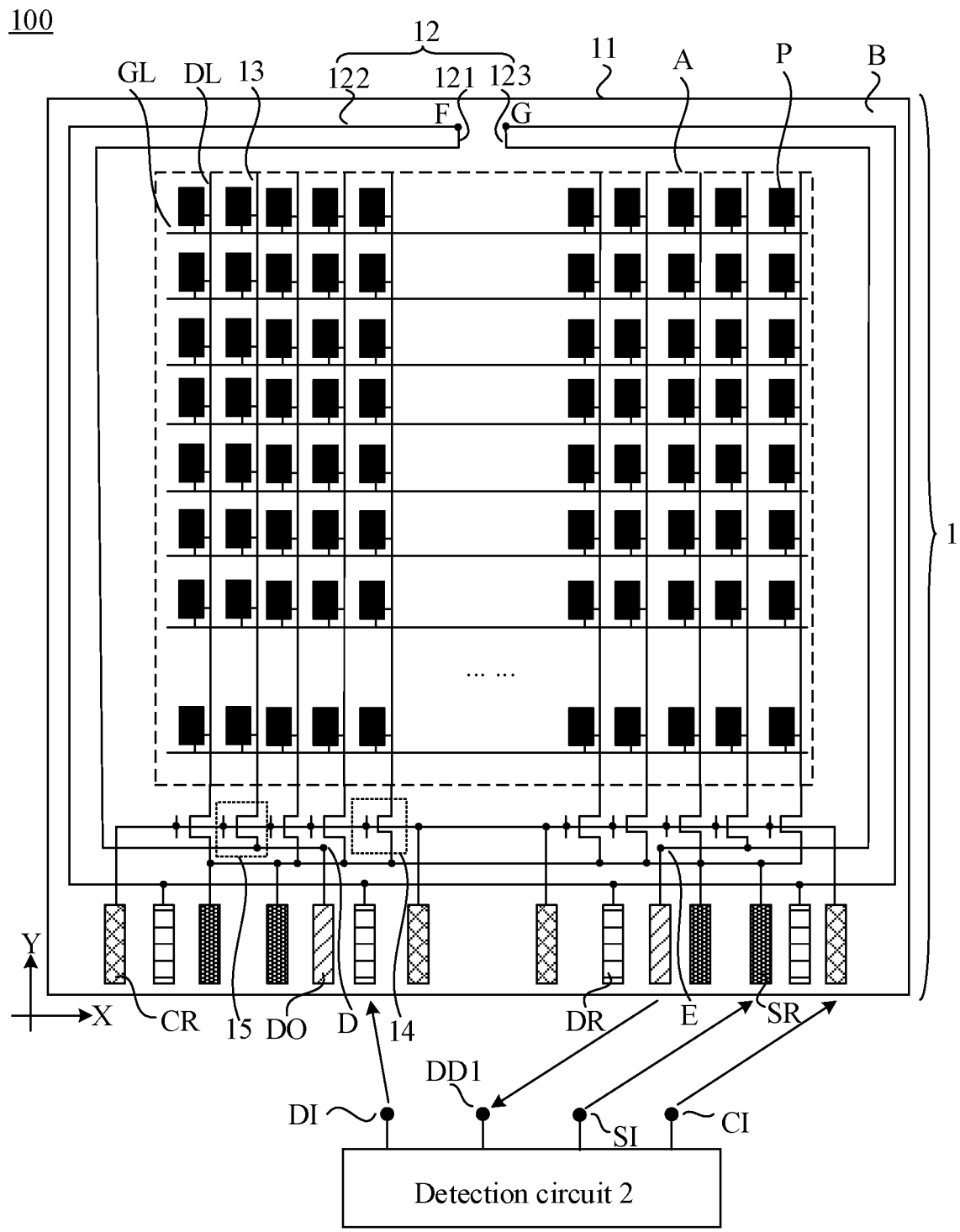
FIG. 5 is a structural diagram of yet another display module, in accordance with some embodiments of the present disclosure.
Figure 6:
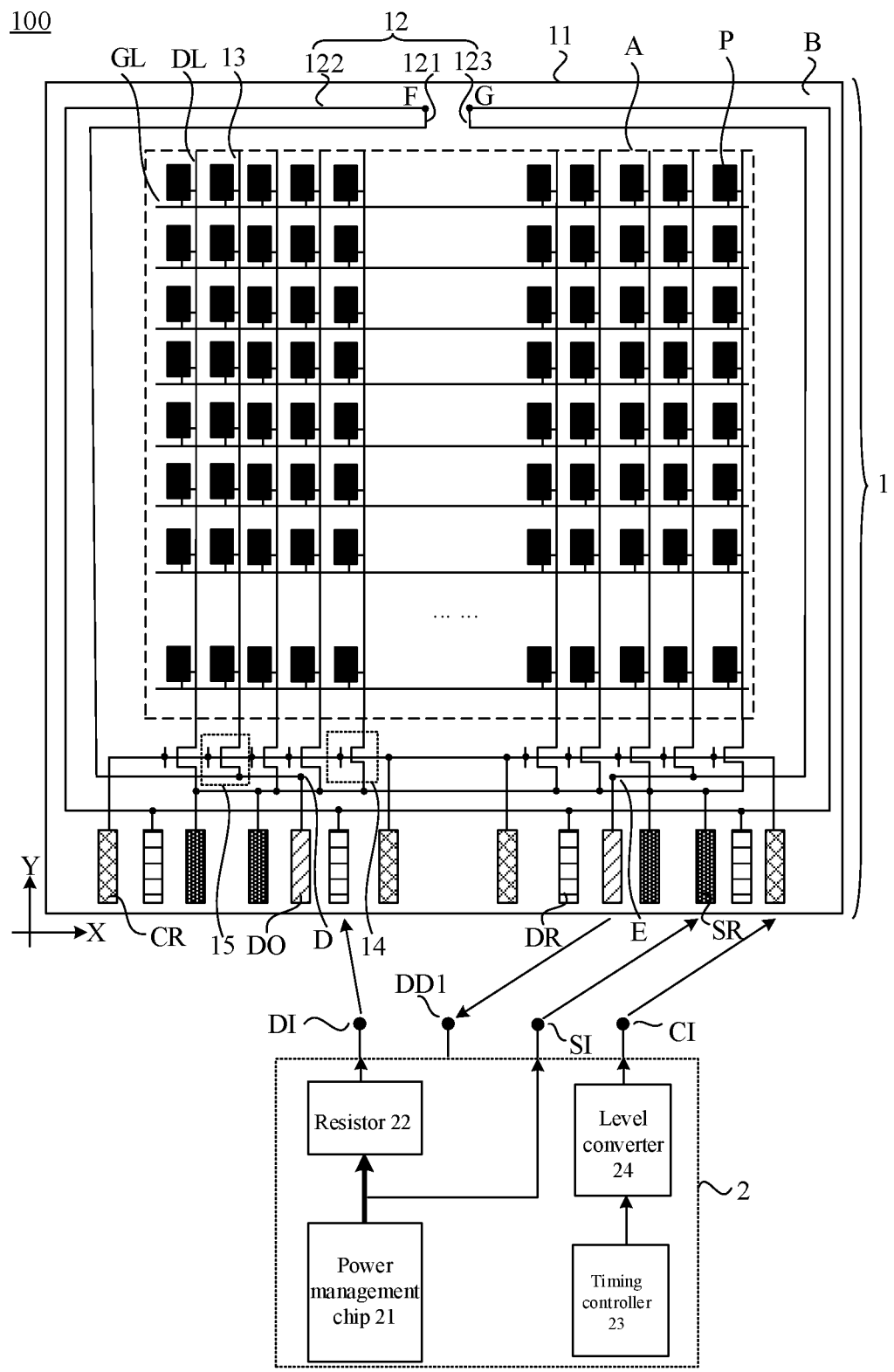
FIG. 6 is a structural diagram of yet another display module, in accordance with some embodiments of the present disclosure.

In some embodiments, as shown in FIGS. 5 and 6, the detection circuit 2 is further coupled to first control signal input terminal(s) CI and display signal input terminal(s) SI. The detection circuit 2 is further configured to: generate and transmit a first control signal to first control signal receiving terminal(s) CR through the first control signal input terminal(s) CI; and generate and transmit a display signal to display signal receiving terminal(s) SR through the display signal input terminal(s) SI.

In some examples, as shown in FIGS. 5 and 6, the display panel 1 further includes a plurality of second detection lines 13 disposed in the display area A.

For example, an extending direction of the plurality of second detection lines 13 is the same or approximately the same as an extending direction of plurality of the data lines DL. That is, the plurality of second detection lines 13 also extend along the second direction Y. Alternatively, due to process errors, the extending direction of the plurality of second detection lines 13 and the second direction Y have a certain included angle therebetween.

As shown in FIGS. 5 and 6, a second detection line 13 may be coupled to (may be electrically connected to) pixel driving circuits in sub-pixels P arranged in a column along the second direction Y.

Based on this, in a process of the display panel 1 displaying image(s), the second detection lines 13 each may receive and transmit the data signal to pixel driving circuits in corresponding sub-pixels P, and may cooperate with the data lines DL to enable the plurality of sub-pixels P in the display panel 1 to display the image(s).

For example, the plurality of second detection lines 13 and the plurality of data lines DL are made of a same material, and are arranged in a same layer.

It will be noted that the term "same layer" herein means that a film layer for forming a specific pattern is formed by a same film forming process, and then is patterned by one patterning process using a same mask to form a layer structure. Depending on different specific patterns, the one patterning process may include several exposure, development or etching processes, and the specific patterns in the formed layer structure may be continuous or discontinuous, and these specific patterns may also be at different heights or have different thicknesses. In this way, the plurality of second detection lines 13 and the plurality of data lines DL may be manufactured synchronously in one patterning process, which is beneficial to simplifying the manufacturing processes of the display panel 1 and the display module 100.

In some examples, as shown in FIGS. 5 and 6, the display panel 1 further includes a plurality of display transistors 14 and a plurality of detection transistors 15 that are disposed in the bezel area B.

For example, as shown in FIGS. 5 and 6, control electrodes of the plurality of display transistors 14 are coupled to the first control signal receiving terminal(s) CR, first electrodes of the plurality of display transistors 14 are coupled to the at least one display signal receiving terminal SR, and a second electrode of a display transistor 14 is coupled to a data line DL. For example, the coupling in this example may refer to an electrical connection.

Here, the first control signal receiving terminal CR may be coupled to control electrode(s) of at least one display transistor 14. The display signal receiving terminal SR may be coupled to first electrode(s) of at least one display transistor 14. The data lines DL may be coupled to the display transistors 14 in one-to-one correspondence.

In this case, the display transistor 14 is configured to be turned on under a control of the first control signal transmitted by the first control signal receiving terminal CR, so as to transmit the display signal received at the display signal receiving terminal SR to a corresponding data line, so that corresponding sub-pixels P are in a first display state.

For example, as shown in FIGS. 5 and 6, control electrodes of the plurality of detection transistors 15 are coupled to the first control signal receiving terminal(s) CR, first electrodes of the plurality of detection transistors 15 are coupled to the first detection line 12, and a second electrode of a detection transistor 15 is coupled to a second detection line 13. For example, the coupling in this example may refer to an electrical connection.

Here, the first control signal receiving terminal CR may be coupled to control electrode(s) of at least one detection transistor 15. The second detection lines 13 may be coupled to the detection transistors 15 in one-to-one correspondence.

In this case, the detection transistor 15 is configured to be turned on under the control of the first control signal transmitted by the first control signal receiving terminal CR, so as to transmit the detection signal passing through the first detection line 12 to the second detection line 13, so that corresponding sub-pixels P are in a second display state.

A coupling manner of the detection transistor 15 and the first detection line 12 is related to the structure of the first detection line 12. As an example, the first detection line 12 includes the first sub-detection line 121, the second sub-detection line 122 and the third sub-detection line 123.

For example, as shown in FIGS. 5 and 6, in a case where the first detection line 12 includes the first sub-detection line 121, the second sub-detection line 122 and the third sub-detection line 123, the first sub-detection line 121 is coupled to at least one detection transistor 15, and the third sub-detection line 123 is coupled to at least one detection transistor 15.

The first sub-detection line 121 may be coupled to one or more detection transistors 15, and the third sub-detection line 123 may be coupled to one or more detection transistors 15.

A portion of the edge of the display panel 1 corresponding to the first sub-detection line 121 and a portion of the edge of the display panel 1 corresponding to the third sub-detection line 123 each may have crack(s). The first sub-detection line 122 and the third sub-detection line 123 each are coupled to the detection transistor(s) 15, so that it is possible to detect whether there are cracks at different portions of the edge of the display panel 1 by using the same detection method, which is conductive to reducing the complexity of the crack detection.

It is worth mentioning that as shown in FIGS. 5 and 6, the plurality of display transistors 14 and the plurality of detection transistors 15 may be exemplarily located on a same side of the display area A. Accordingly, the signal terminals (e.g., the first control signal receiving terminal(s) CR or the display signal receiving terminal(s) SR), the display transistors 14 and the detection transistors 15 may be located on the same side of the display area A.

This is conducive to simplifying wirings of the display panel 1 and the display module 100, and to reducing the size of the bezel area B of the display panel 1 to facilitate the realization of the narrow bezel.

For example, the first display state means that sub-pixels P corresponding to the display transistors 14 are displayed in a dark state. In a case where the first detection line 12 does not have a crack (i.e., the edge of the display panel 1 does not have a crack), the amplitude of the detection signal transmitted to the detection transistor 15 through the first detection line 12 is basically unchanged or slightly reduced, and sub-pixels P corresponding to the detection transistor 15 are displayed in the dark state. In a case where the first detection line 12 has crack(s) (i.e., the edge of the display panel 1 has crack(s)), the amplitude of the detection signal transmitted to the detection transistor 15 through the first detection line 12 is reduced, and thus, the sub-pixels P corresponding to the detection transistor 15 are displayed in a bright state.

By judging the second display state, it can be determined whether the edge of the display panel 1 has crack(s).

The number of the display transistors 14 and the number of the detection transistors 15 may be set according to actual needs. The number of the detection transistors 15 is, for example, related to a resolution of the display panel 1.

For example, the plurality of sub-pixels P in the display panel 1 include red sub-pixels, green sub-pixels and blue sub-pixels. The resolution of the display panel 1 is, for example, 7680 by 1920.

For example, the number of the detection transistor(s) 15 coupled to the first sub-detection line 121 may be 240. Accordingly, the number of the second detection lines 13 respectively coupled to the 240 detection transistors 15 may be 240, and a ratio of this number of the second detection lines 13 to the number of columns of the plurality of sub-pixels P is 1:32.

For another example, the number of the detection transistor(s) 15 coupled to the third sub-detection line 123 may be 240. Accordingly, the number of the second detection lines 13 respectively coupled to the 240 detection transistors 15 may be 240, and a ratio of this number of the second detection lines 13 to the number of columns of the plurality of sub-pixels P is 1:32.

Here, sub-pixels P coupled to the second detection line 13 may be at least one of red sub-pixels, green sub-pixels and blue sub-pixels. Since human eyes are more sensitive to green light than red light and blue light, the sub-pixels P coupled to the second detection line 13 are green sub-pixels as an example in the embodiments of the present disclosure.

In some examples, as shown in FIG. 6, in a case where the detection circuit 2 includes the power management chip 21, an end of the power management chip 21 coupled to the resistor 22 is further coupled to the display signal input terminal(s) SI. The power management chip 21 is further configured to generate the display signal. For example, the coupling in this example may refer to an electrical connection.

In this case, during the crack detection of the display panel 1, the power management chip 21 may transmit the generated display signal to corresponding sub-pixels P through the display signal input terminal SI, the display signal receiving terminal SR, the display transistor 14 and a corresponding data line DL in sequence, so that the corresponding sub-pixels P are displayed in the first display state.

For example, the display signal and the detection signal generated by the power management chip 21 may be the same. That is, the display signal and the detection signal may be the first voltage signal VGH. The first voltage signal VGH generated by the power management chip 21 may be transmitted to the display signal input terminal(s) SI and the detection signal input terminal(s) DI synchronously, so that the crack detection of the display panel 1 may be synchronously performed by using two crack detection methods.

For example, the power management chip 21 and the display signal input terminal SI may be electrically connected through a wire. The wire has a small line width, so that an amplitude of the display signal may be reduced by using the wire, so as to avoid a negative effect of the display signal on the display transistor 14.

In some examples, as shown in FIG. 6, the detection circuit 2 further includes a timing controller 23 and a level converter 24. An end of the level converter 24 is coupled to the timing controller 23, and another end of the level converter 24 is coupled to the first control signal input terminal(s) CI. For example, the coupling in this example may refer to an electrical connection.

For example, the timing controller 23 is configured to generate a general purpose input-output level signal. The level converter 24 is configured to convert the general purpose input-output level signal into the first control signal to transmit the first control signal to the first control signal input terminal(s) CI.

Here, during the crack detection of the display panel 1, the timing controller 23 may generate the general purpose input-output level signal, and the level converter 24 may receive the general purpose input-output level signal and convert the general purpose input-output level signal into the first control signal. The display transistors 14 and the detection transistors 15 may be turned on synchronously under the control of the first control signal, so that the sub-pixels P corresponding to the display transistors 14 are displayed in the first display state, and the sub-pixels P corresponding to the detection transistors 15 are displayed in the second display state. By judging the second display state, it can be determined whether the display panel 1 has crack(s), so as to realize the crack detection of the display panel 1.

It will be noted that based on the connection relationships of the display transistor 14 and the connection relationships of the detection transistor 15, the display transistor 14 and the detection transistor 15 may be the same type of transistors. For example, the display transistor 14 and the detection transistor 15 may be N-type transistors, or may be P-type transistors.

In some embodiments of the present disclosure, the operating process of the detection circuit 2 for the crack detection will be schematically described in an example where the display transistor 14 and the detection transistor 15 are the P-type transistors.

For example, in a case where the crack detection is required for the display panel 1, the first control signal converted by the level converter 24 may be referred to as a second voltage signal VGL. The second voltage signal VGL is, for example, a direct current low level signal.

Here, the "high level" and the "low level" herein are relative. For example, an amplitude of the second voltage signal VGL is less than an amplitude of the first voltage signal VGH.

After the display panel 1 and the detection circuit 2 are manufactured, the detection circuit 2 may be coupled to the display panel 1.

The timing controller 23 may generate and transmit the general purpose input-output level signal to the level converter 24, and the level converter 24 may convert the general purpose input-output level signal into the first control signal at a low level. The first control signal may be transmitted to the control electrodes of the display transistors 14 and the control electrodes of the detection transistors 15 through the first control signal input terminal(s) CI and the first control signal receiving terminal(s) CR in sequence. The display transistors 14 and the detection transistors 15 may be turned on under the control of the first control signal at the low level.

The display signal generated by the power management chip 21 may be transmitted to the first electrodes of the display transistors 14 through the display signal input terminal(s) SI and the display signal receiving terminal(s) SR in sequence. The display transistor 14 may receive and transmit the display signal to a corresponding data line DL, so that the corresponding sub-pixels P are displayed in the dark state.

The detection signal generated by the power management chip 21 may be transmitted to the second sub-detection line 122 through the detection signal input terminal(s) DI and the detection signal receiving terminal(s) DR in sequence.

The detection signal passing through the second sub-detection line 122 and the first sub-detection line 121 may be transmitted to the first electrode(s) of the detection transistor(s) 15 coupled to the first sub-detection line 121. The detection transistor 15 may receive and transmit the detection signal to a corresponding second detection line 13, so that corresponding sub-pixels P are displayed in the second display state. In a case where the second display state is the dark state, the portion of the edge of the display panel 1 corresponding to the first sub-detection line 121 is basically free of cracks. In a case where the second display state is the bright state, the portion of the edge of the display panel 1 corresponding to the first sub-detection line 121 has crack(s).

The detection signal passing through the second sub-detection line 122 and the third sub-detection line 123 may be transmitted to the first electrode(s) of the detection transistor(s) 15 coupled to the third sub-detection line 123. The detection transistor 15 may receive and transmit the detection signal to a corresponding second detection line 13, so that corresponding sub-pixels P are displayed in the second display state. In the case where the second display state is the dark state, the portion of the edge of the display panel 1 corresponding to the third sub-detection line 123 is basically free of cracks. In the case where the second display state is the bright state, the portion of the edge of the display panel 1 corresponding to the third sub-detection line 123 has crack(s).

In addition, it will be noted that in a case where the display panel 1 needs to display image(s), but does not need to the crack detection, the level converter 24 may convert the general purpose input-output level signal into the first voltage signal VGH. The first voltage signal VGH may be transmitted to the control electrodes of the display transistors 14 and the control electrodes of the detection transistors 15 through the first control signal input terminal(s) CI and the first control signal receiving terminal(s) CR in sequence. The display transistors 14 and the detection transistors 15 may be turned off under a control of the first voltage signal VGH, so that the sub-pixels P corresponding to the display transistors 14 and the sub-pixels P corresponding to the detection transistors 15 are prevented from being affected during the image display, thereby ensuring the normal display of the display panel 1.

Figure 7:
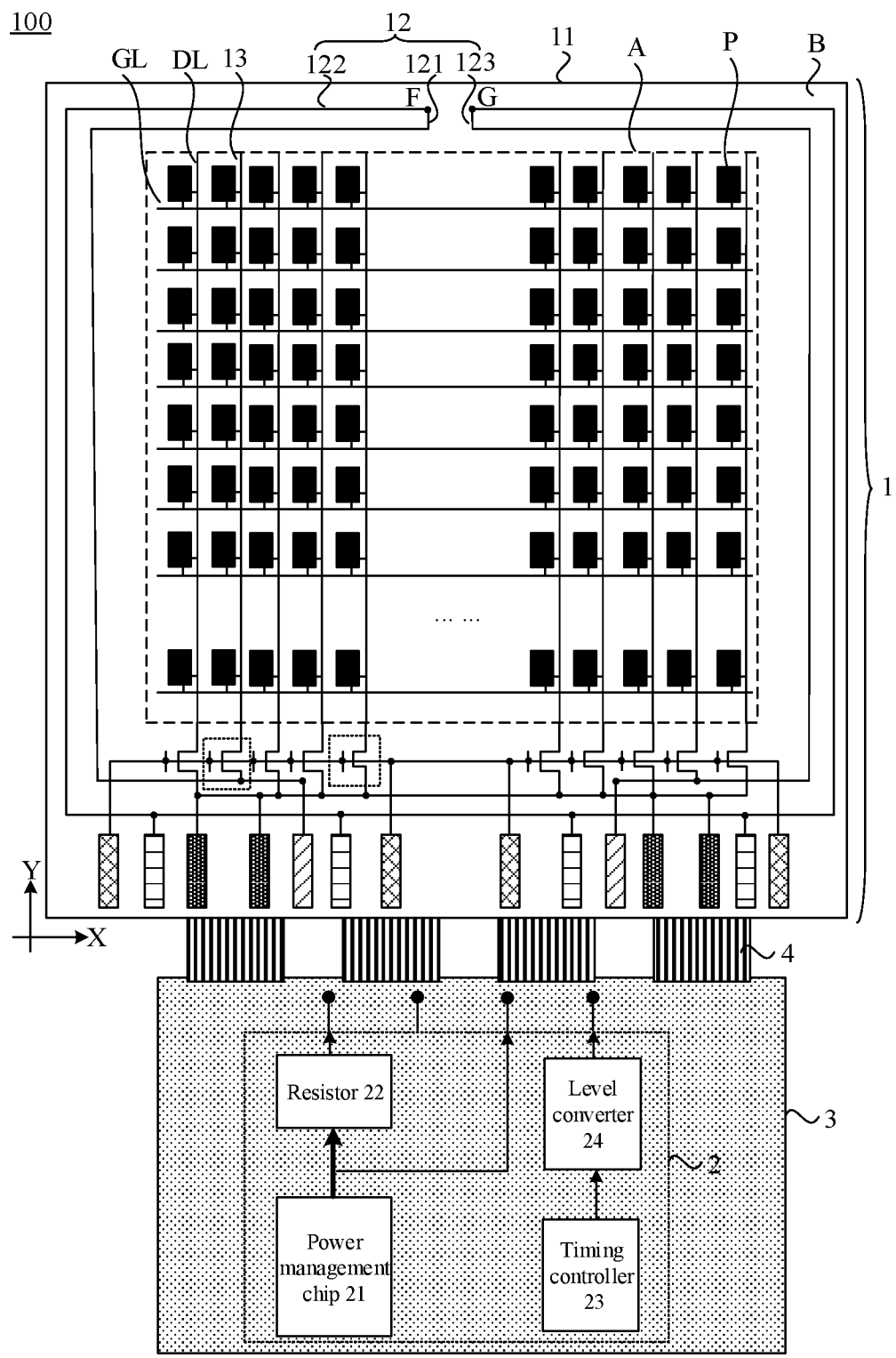
FIG. 7 is a structural diagram of yet another display module, in accordance with some embodiments of the present disclosure.
Figure 8:
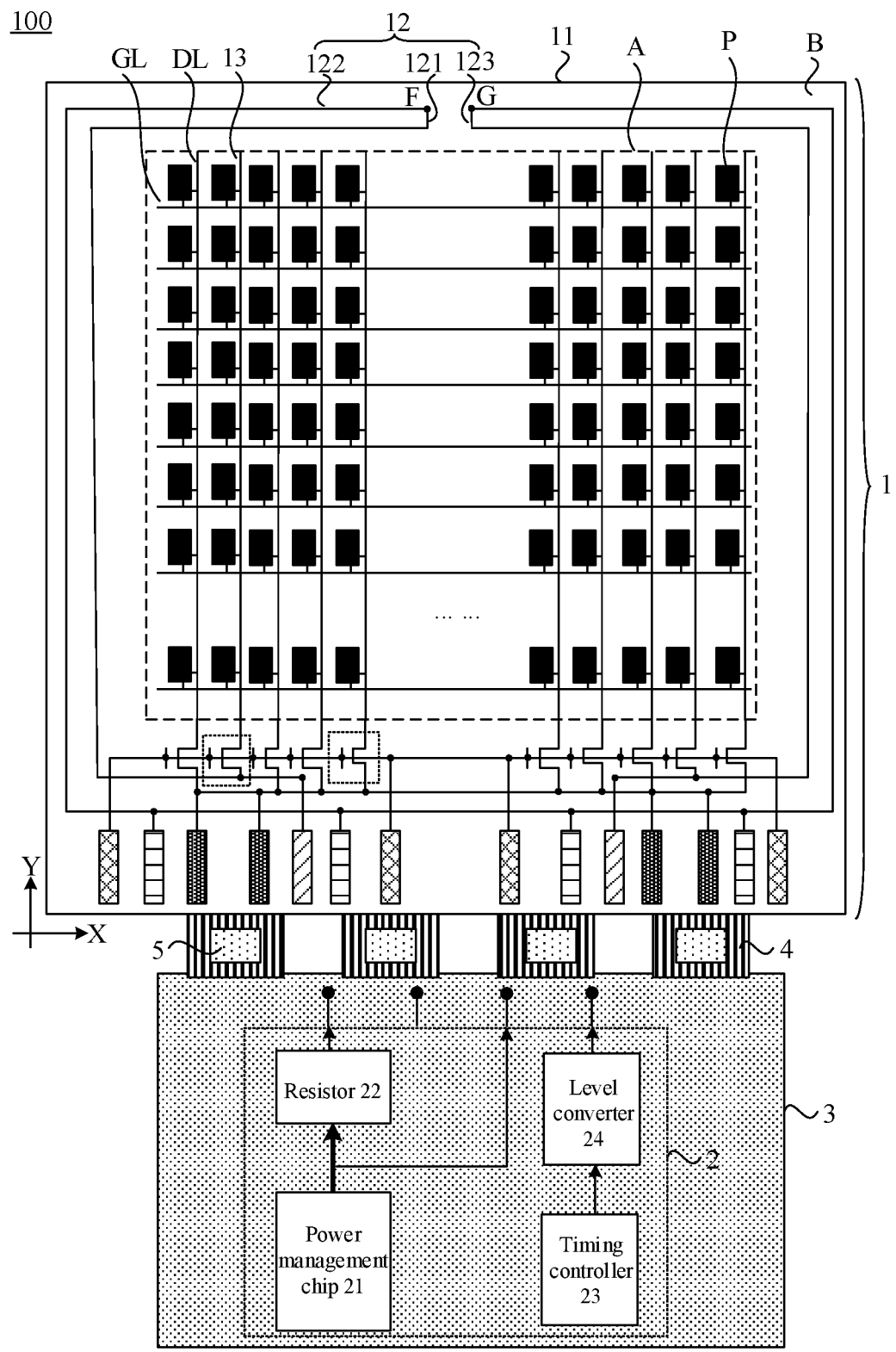
FIG. 8 is a structural diagram of yet another display module, in accordance with some embodiments of the present disclosure.

In some embodiments, as shown in FIGS. 7 and 8, the display module 100 further includes a circuit board 3. The circuit board 3 is coupled to the detection circuit 2.

In some examples, the circuit board 3 may be a printed circuit board (PCB) or a circuit board assembled with various electronic devices through a surface encapsulation process (i.e., printed circuit board assembly, PCBA).

For example, the circuit board 3 may carry the detection circuit 2. The power management chip 21, the resistor 22, the timing controller 23 and the level converter 24 in the detection circuit 2 may be coupled to the circuit board 3 by bonding. The components in the detection circuit 2 may be coupled through wires in the circuit board 3.

In some embodiments, the circuit board 3 and the display panel 1 are connected together by bonding, thereby realizing the coupling between the detection circuit 2 and the display panel 1. A connection manner of the circuit board 3 and the display panel 1 varies, and may be set according to actual needs.

In some examples, as shown in FIGS. 7 and 8, the display module 100 further includes at least one COF (i.e., Chip On Flex or Chip On Film) 4. An end of the COF 4 is bonded to the circuit board 3, and another end of the COF 4 is bonded to the display panel 1.

For example, there may be one or more COFs 4. In this way, the circuit board 3 may be bonded to the display panel 1 through the one or more COFs 4.

In some other examples, the display module 100 further includes a flexible printed circuit (FPC). An end of the FPC is bonded to the circuit board 3, and another end of the FPC is bonded to the display panel 1. In this way, the circuit board 3 may be bonded to the display panel 1 through the FPC.

In some embodiments, as shown in FIG. 8, the display module 100 further includes source driver chip(s) 5 bonded to the COF(s) 4.

In some examples, in a case where the display panel 1 includes the plurality of data lines DL and the plurality of second detection lines 13, the source driver chip 5 may be coupled to at least one data line DL and at least one second detection line 13. The coupling in this example may be realized by bonding.

There may be at least one source driver chip.

For example, in a case where there may be a single source driver chip 5, the source driver chip 5 may be coupled to the plurality of data lines DL and the plurality of second detection lines 13 included in the display panel 1.

For another example, in a case where there may be a plurality of source driver chips 5, the source driver chips 5 may be arranged in one-to-one correspondence with the COFs 4. The number of the data line(s) DL and the number of the second detection line(s) 13 to which each source driver chip 5 is coupled may be set according to actual needs.

In some examples, in a case where the detection circuit 2 further includes the timing controller 23, the source driver chip 5 is further coupled to the timing controller 23. The coupling in this example may be a communication coupling, and the source driver chip 5 and the timing controller 23 have a communication protocol therebetween.

For example, the timing controller 23 is further configured to generate a second control signal. The source driver chip 5 is configured to allow the second detection line(s) 13 to be in a floating state under a control of the second control signal.

For example, in a case where the crack detection is required for the display panel 1, the timing controller 23 may send a command related to the crack detection to the source driver chip 5 through the communication protocol. The source driver chip 5 may change an operation mode due to the action of this command, so that the second detection line(s) 13 coupled to the source driver chip 5 are in the floating state. Then, the timing controller 23 may generate the general purpose input-output level signal to the level converter 24, so that the level converter 24 converts the general purpose input-output level signal into the first control signal at the low-level.

An operating process of a subsequent crack detection of the display panel 1 may refer to the above description in some embodiments, and will not be repeated here.

In addition, it will be noted that in the case where the display panel 1 needs to display image(s), but does not need to the crack detection, the timing controller 23 may send a command related to the image display to the source driver chip 5 through the communication protocol. The source driver chip 5 may change the operation mode due to an action of this command, so that the second detection line(s) 13 coupled to the source driver chip 5 are in an operating state, and thus, the image display may be performed.

In some embodiments of the present disclosure, in the case where the source driver chip 5 does not have the PCD function, by using a plurality of devices in the display module 100 such as the power management chip 21, the resistor 22, the timing controller 23, the level converter 24, and the source driver chip(s) 5, and by establishing the coupling relationships between the plurality of devices, the timing controller 23 may be used for changing the operation mode of the source driver chip 5, thereby realizing the crack detection of the display panel 1. In this way, the structure of the source driver chip 5 may be prevented from being changed, and there is no need to set up an additional detection circuit, and thus, an additional manufacturing process of the display module 100 may be avoided. Therefore, on the basis of reducing the waste of materials and improving the yield of the display module 100 and the display apparatus 1000, an increase in the structural complexity of the display module 100 and the display apparatus 1000 may be avoided, so that the manufacturing difficulty of the display module 100 and the display apparatus 1000 is reduced.

Here, it will be mentioned that in some examples, the signal terminals (such as the second detection signal detecting terminal DD2 and the detection signal input terminal DI) coupled to the detection circuit each may have a structure of conductive substrate. The signal terminals coupled to the first detection line 12, the signal terminals coupled to the display transistors 14 and the signal terminals coupled to the detection transistors 15 each may have a structure of conductive pin.

Figure 9:
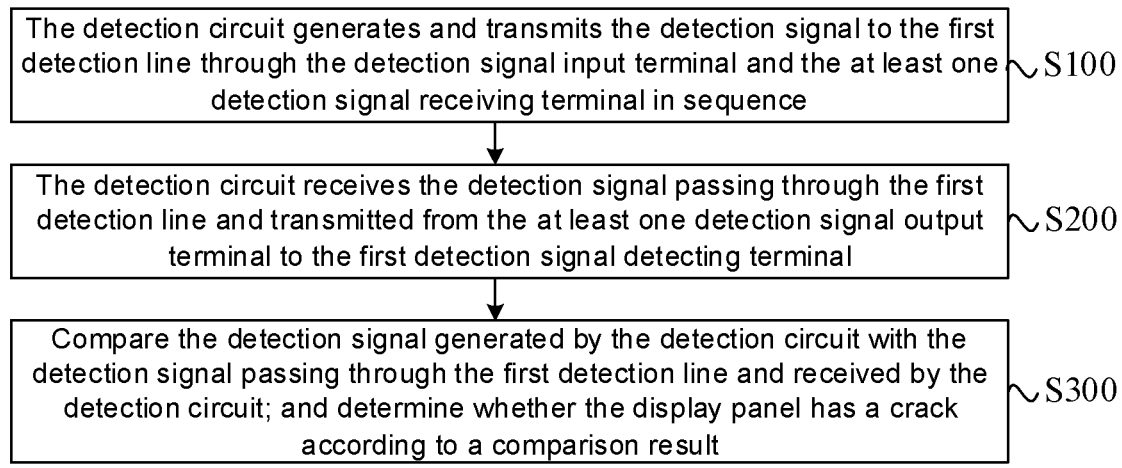
FIG. 9 is a flow diagram of a crack detection method, in accordance with some embodiments of the present disclosure.

Some embodiments of the present disclosure provide a crack detection method for performing a crack detection on the display module 100 in any one of the above embodiments. As shown in FIG. 9, the crack detection method includes S100 to S300.

In S100, the detection circuit generates and transmits the detection signal to the first detection line through the detection signal input terminal and the detection signal receiving terminal in sequence.

In S200, the detection circuit receives the detection signal passing through the first detection line and transmitted from the detection signal output terminal to the first detection signal detecting terminal.

In S300, the detection signal generated by the detection circuit is compared with the detection signal passing through the first detection line and received by the detection circuit, and it is determined whether the display panel has a crack according to a comparison result.

Figure 10:
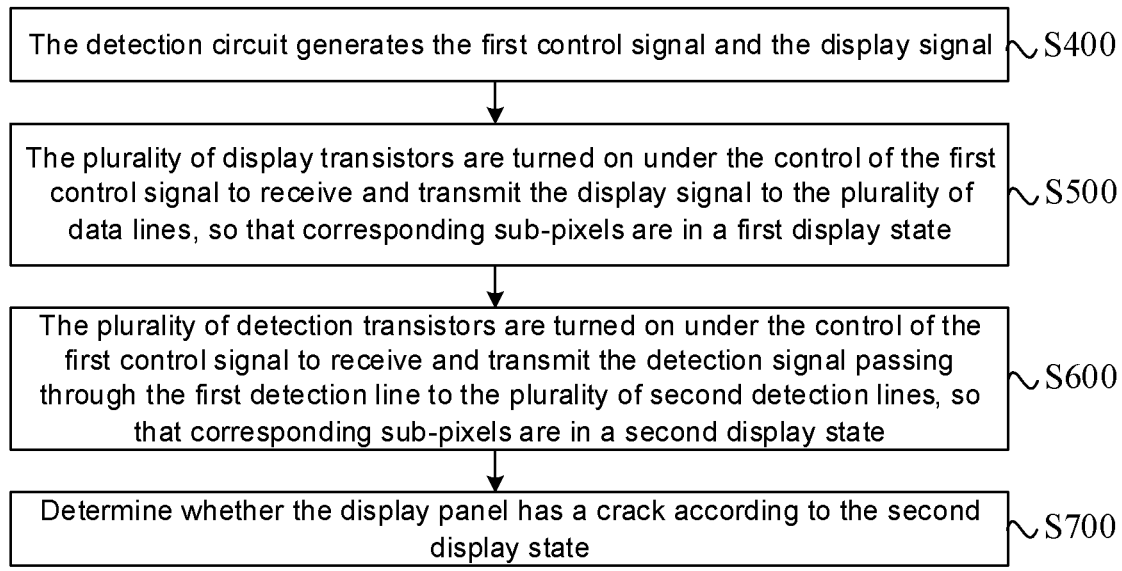
FIG. 10 is a flow diagram of another crack detection method, in accordance with some embodiments of the present disclosure.

In some embodiments, as shown in FIG. 10, the crack detection method may further include S400 to S700.

In S400, the detection circuit generates a first control signal and a display signal.

In S500, the plurality of display transistors are turned on under a control of the first control signal, and receives and transmits the display signal to the plurality of data lines, so that corresponding sub-pixels are in a first display state.

In S600, the plurality of detection transistors are turned on under the control of the first control signal, and receives and transmits the detection signal passing through the first detection line to the plurality of second detection lines, so that corresponding sub-pixels are in a second display state.

In S700, it is determined whether the display panel has a crack according to the second display state.

Specific details, principles and effects of the crack detection method provided in some embodiments of the present disclosure may refer to the description of the structure and effects of the display module 100 and the description of the process of the crack detection of the display panel 1 in any one of the above embodiments, and will not be repeated here.

It will be noted that the steps of the crack detection method are numbered in the embodiments of the present disclosure, which is only for describing the steps more clearly, and is not for limiting an execution sequence of the steps.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module, comprising:
   a display panel having a display area and a bezel area located beside the display area; wherein the display panel includes a first detection line disposed in the bezel area; the first detection line is electrically connected to at least one detection signal receiving terminal and at least one detection signal output terminal directly; and
   a detection circuit electrically connected to a detection signal input terminal and a first detection signal detecting terminal directly; wherein the detection signal input terminal is coupled to the at least one detection signal receiving terminal, and the at least one detection signal output terminal is coupled to the first detection signal detecting terminal;
   wherein the detection circuit is configured to: generate and transmit a detection signal to the first detection line through the detection signal input terminal and the at least one detection signal receiving terminal in sequence; and receive the detection signal passing through the first detection line and transmitted from the at least one detection signal output terminal to the first detection signal detecting terminal,
   wherein the display panel further includes:
   a plurality of data lines and a plurality of second detection lines disposed in the display area, wherein an extending direction of the plurality of data lines is the same or approximately the same as an extending direction of the plurality of second detection lines;
   a plurality of sub-pixels electrically connected to the plurality of data lines and the plurality of second detection lines directly; and
   a plurality of display transistors and a plurality of detection transistors disposed in the bezel area, wherein control electrodes of the plurality of display transistors and control electrodes of the plurality of detection transistors are electrically connected to a first control signal receiving terminal directly; first electrodes of the plurality of display transistors are electrically connected to at least one display signal receiving terminal directly and disconnected to the first detection line, and a second electrode of a display transistor in the plurality of display transistors is electrically connected to a data line in the plurality of data lines directly; first electrodes of the plurality of detection transistors are electrically connected to the first detection line directly, and a second electrode of a detection transistor in the plurality of detection transistors is electrically connected to a second detection line in the plurality of second detection lines directly, wherein
   the detection circuit is further electrically connected to a first control signal input terminal and a display signal input terminal directly; the display signal input terminal is coupled to the at least one display signal receiving terminal; and the detection circuit is further configured to: generate and transmit a first control signal to the first control signal receiving terminal through the first control signal input terminal; and generate and transmit a display signal to the at least one display signal receiving terminal through the display signal input terminal;
   the display transistors are configured to be turned on under a control of the first control signal to transmit the display signal to the data lines, so that corresponding sub-pixels are in a first display state; and
   the detection transistors are configured to be turned on under the control of the first control signal to transmit the detection signal passing through the first detection line to the second detection lines, so that corresponding sub-pixels are in a second display state.

2. The display module according to claim 1, wherein the detection circuit includes a power management chip and a resistor; wherein
   the power management chip is configured to generate the detection signal;
   an end of the resistor is coupled to the power management chip, and another end of the resistor is coupled to the detection signal input terminal; and
   the resistor is configured to reduce an amplitude of the detection signal.

3. The display module according to claim 2, wherein the another end of the resistor and the detection signal input terminal are further coupled to a second detection signal detecting terminal.

4. The display module according to claim 2, wherein a resistance value of the resistor is less than or equal to 10Ω.

5. The display module according to claim 2, wherein the first detection line has a loop shape with an opening, and surrounds the display area; and
the first detection line has a first end and a second end; wherein
the at least one detection signal receiving terminal includes a detection signal receiving terminal, and the first end of the first detection line is coupled to the detection signal receiving terminal; and the at least one detection signal output terminal includes a detection signal output terminal, and the second end of the first detection line is coupled to the detection signal output terminal.

6. The display module according to claim 2, wherein the first detection line has a first end, a second end, a first node and a second node; and
the first detection line includes a first sub-detection line located between the first end and the first node, a second sub-detection line located between the first node and the second node, and a third sub-detection line located between the second node and the second end; wherein
the second sub-detection line has a loop shape with an opening, and surrounds the display area; the first sub-detection line and the third sub-detection line are respectively located on two opposite sides of the display area;
wherein the second sub-detection line is coupled to the at least one detection signal receiving terminal; and
the at least one detection signal output terminal includes two detection signal output terminals; and the first end and the second end of the first detection line are respectively coupled to the two detection signal output terminals.

7. The display module according to claim 1, wherein the first detection line has a loop shape with an opening, and surrounds the display area; and
the first detection line has a first end and a second end; wherein
the at least one detection signal receiving terminal includes a detection signal receiving terminal, and the first end of the first detection line is coupled to the detection signal receiving terminal; and the at least one detection signal output terminal includes a detection signal output terminal, and the second end of the first detection line is coupled to the detection signal output terminal.

8. The display module according to claim 1, wherein the first detection line has a first end, a second end, a first node and a second node; and
the first detection line includes a first sub-detection line located between the first end and the first node, a second sub-detection line located between the first node and the second node, and a third sub-detection line located between the second node and the second end; wherein
the second sub-detection line has a loop shape with an opening, and surrounds the display area; the first sub-detection line and the third sub-detection line are respectively located on two opposite sides of the display area;
wherein the second sub-detection line is coupled to the at least one detection signal receiving terminal; and
the at least one detection signal output terminal includes two detection signal output terminals; and the first end and the second end of the first detection line are respectively coupled to the two detection signal output terminals.

9. The display module according to claim 8, the first sub-detection line and the third sub-detection line are located on a side of the second sub-detection line proximate to the display area.

10. The display module according to claim 8, wherein the first sub-detection line and the third sub-detection line each are U-shaped, and each surround a portion of the display area.

11. The display module according to claim 1, wherein the detection circuit includes a power management chip and a resistor, wherein the power management chip is configured to generate the detection signal; an end of the resistor is coupled to the power management chip, and another end of the resistor is coupled to the detection signal input terminal; the resistor is configured to reduce an amplitude of the detection signal;
an end of the power management chip coupled to the resistor is further coupled to the display signal input terminal; and the power management chip is further configured to generate the display signal;
the detection circuit further includes a timing controller and a level converter;
the timing controller is configured to generate a general purpose input-output level signal;
an end of the level converter is coupled to the timing controller, and another end of the level converter is coupled to the first control signal input terminal; and
the level converter is configured to convert the general purpose input-output level signal into the first control signal, and transmit the first control signal to the first control signal input terminal.

12. The display module according to claim 11, further comprising;
a circuit board coupled to the detection circuit;
at least one COF; wherein an end of the COF is bonded to the circuit board, and another end of the COF is bonded to the display panel; and
at least one source driver chip bonded to the at least one COF; wherein
a source driver chip in the at least one source driver chip is coupled to the timing controller, at least one data line in the plurality of data lines and at least one second detection line in the plurality of second detection lines;
the timing controller is further configured to generate a second control signal; and
the source driver chip is configured to allow the at least one second detection line to be in a floating state under a control of the second control signal.

13. The display module according to claim 1, wherein the first detection line has a first end, a second end, a first node and a second node; the first detection line includes a first sub-detection line located between the first end and the first node, a second sub-detection line located between the first node and the second node and a third sub-detection line located between the second node and the second end; wherein
the second sub-detection line has a loop shape with an opening, and surrounds the display area; the first sub-detection line and the third sub-detection line are respectively located on two opposite sides of the display area; the second sub-detection line is coupled to the at least one detection signal receiving terminal; the at least one detection signal output terminal includes two detection signal output terminals, and the first end and the second end of the first detection line are respectively coupled to the two detection signal output terminals; and the first sub-detection line is coupled to at least one detection transistor in the plurality of detection transistors, and the third sub-detection line is coupled to at least one detection transistor in the plurality of detection transistors.

14. The display module according to claim 1, wherein the plurality of data lines and the plurality of second detection lines are made of a same material, and are arranged in a same layer.

15. The display module according to claim 1, further comprising:
a circuit board coupled to the detection circuit; and
at least one COF; wherein an end of the COF is bonded to the circuit board, and another end of the COF is bonded to the display panel.

16. A display apparatus, comprising the display module according to claim 1.

17. The display module according to claim 1, wherein the plurality of display transistors and the plurality of detection transistors are located on a same side of the display area.

18. A crack detection method for a crack detection of a display module,
the display module including:
a display panel having a display area and a bezel area located beside the display area, wherein the display panel includes a first detection line disposed in the bezel area; and the first detection line is electrically connected to at least one detection signal receiving terminal and at least one detection signal output terminal directly; and
a detection circuit electrically connected to a detection signal input terminal and a first detection signal detecting terminal directly, wherein the detection signal input terminal is coupled to the at least one detection signal receiving terminal, and the at least one detection signal output terminal is coupled to the first detection signal detecting terminal;
the crack detection method comprising:
generating and transmitting, by the detection circuit, a detection signal to the first detection line through the detection signal input terminal and the at least one detection signal receiving terminal in sequence;
receiving, by the detection circuit, the detection signal passing through the first detection line and transmitted from the at least one detection signal output terminal to the first detection signal detecting terminal;
comparing the detection signal generated by the detection circuit with the detection signal passing through the first detection line and received by the detection circuit; and
determining whether the display panel has a crack according to a comparison result, wherein the display panel further includes:
a plurality of data lines and a plurality of second detection lines disposed in the display area, wherein an extending direction of the plurality of data lines is the same or approximately the same as an extending direction of the plurality of second detection lines;
a plurality of sub-pixels electrically connected to the plurality of data lines and the plurality of second detection lines directly; and
a plurality of display transistors and a plurality of detection transistors disposed in the bezel area, wherein control electrodes of the plurality of display transistors and control electrodes of the plurality of detection transistors are electrically connected to a first control signal receiving terminal directly; first electrodes of the plurality of display transistors are electrically connected to at least one display signal receiving terminal directly and disconnected to the first detection line, and a second electrode of a display transistor in the plurality of display transistors is electrically connected to a data line in the plurality of data lines directly; first electrodes of the plurality of detection transistors are electrically connected to the first detection line directly, and a second electrode of a detection transistor in the plurality of detection transistors is electrically connected to a second detection line in the plurality of second detection lines directly,
wherein the detection circuit is further electrically connected to a first control signal input terminal and a display signal input terminal directly; the display signal input terminal is coupled to the at least one display signal receiving terminal; the detection circuit is further configured to: generate and transmit a first control signal to the first control signal receiving terminal through the first control signal input terminal; and generate and transmit a display signal to the at least one display signal receiving terminal through the display signal input terminal;
the crack detection method further comprises:
generating, by the detection circuit, the first control signal and the display signal;
receiving and transmitting, by the plurality of display transistors turned on under control of the first control signal, the display signal to the plurality of data lines, so that corresponding sub-pixels are in a first display state;
receiving and transmitting, by the plurality of detection transistors turned on under the control of the first control signal, the detection signal passing through the first detection line to the plurality of second detection lines, so that corresponding sub-pixels are in a second display state; and
determining whether the display panel has a crack according to the second display state.

* * * * *